United States Patent
Li et al.

(10) Patent No.: US 11,183,262 B2
(45) Date of Patent: Nov. 23, 2021

(54) DATA VERIFYING METHOD, CHIP, AND VERIFYING APPARATUS

(71) Applicant: Taiwan Semiconductor Manufacturing Co., Ltd., Hsinchu (TW)

(72) Inventors: Mao-Ruei Li, Hsinchu (TW); Fan-Ming Kuo, Hsinchu County (TW); Wei-Li Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/851,107

(22) Filed: Apr. 17, 2020

(65) Prior Publication Data

US 2021/0327528 A1     Oct. 21, 2021

(51) Int. Cl.
| | |
|---|---|
| *G11C 29/00* | (2006.01) |
| *G11C 29/42* | (2006.01) |
| *G11C 29/44* | (2006.01) |
| *G11C 29/12* | (2006.01) |
| *G11C 29/56* | (2006.01) |
| *G11C 29/46* | (2006.01) |

(52) U.S. Cl.
CPC .......... *G11C 29/42* (2013.01); *G11C 29/1201* (2013.01); *G11C 29/44* (2013.01); *G11C 29/46* (2013.01); *G11C 29/56* (2013.01); *G11C 2029/5602* (2013.01)

(58) Field of Classification Search
CPC ..... G11C 29/42; G11C 29/1201; G11C 29/44; G11C 29/46; G11C 29/56; G11C 2029/5602
See application file for complete search history.

(56) References Cited

U.S. PATENT DOCUMENTS

| | | | |
|---|---|---|---|
| 10,565,381 B2 * | 2/2020 | Lai | G06F 8/65 |
| 10,643,116 B1 * | 5/2020 | Strater, Jr. | G06K 7/10435 |
| 2014/0169091 A1 * | 6/2014 | Yao | G11C 29/42 365/185.09 |
| 2020/0396458 A1 * | 12/2020 | Francois | H04N 19/186 |

* cited by examiner

*Primary Examiner* — Pho M Luu
(74) *Attorney, Agent, or Firm* — JCIPRNET

(57) ABSTRACT

A data verifying method, a chip, and a verifying apparatus are provided. In the method, an encoder is provided for at least one processing circuit of a chip. One or more transmitting data of a to-be-test circuit of the processing circuit is encoded through the encoder to generate one or more parity data. The transmitting data is a computing result generated by the to-be-test circuit. The parity data is transmitted without the transmitting data. The parity data is used for data verification of the transmitting data.

17 Claims, 5 Drawing Sheets

DATA VERIFYING METHOD, CHIP, AND VERIFYING APPARATUS

BACKGROUND

The chip verification is an important process for designing the chip. In should be noticed that some chips are designed with the limited number of input/output (I/O) interface for exchanging data with an external apparatus such as a data verifying tool. Furthermore, there may be more than one processing circuit (may be called as processing core) integrated into one chip. These processing circuits may be coupled to form network topology, and the network topology is used to reduce the cabling cost in the communication system of the chip. However, both data length and the number of data are limited in the network topology, because the processing circuit merely exchanges the limited amount of data at a time via the network topology. If there are multiple data needed to be transmitted to other processing circuits at the same time, or if multiple processing circuits transmit the multiple data to one processing circuit, it may cost lots of time to transmit all data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
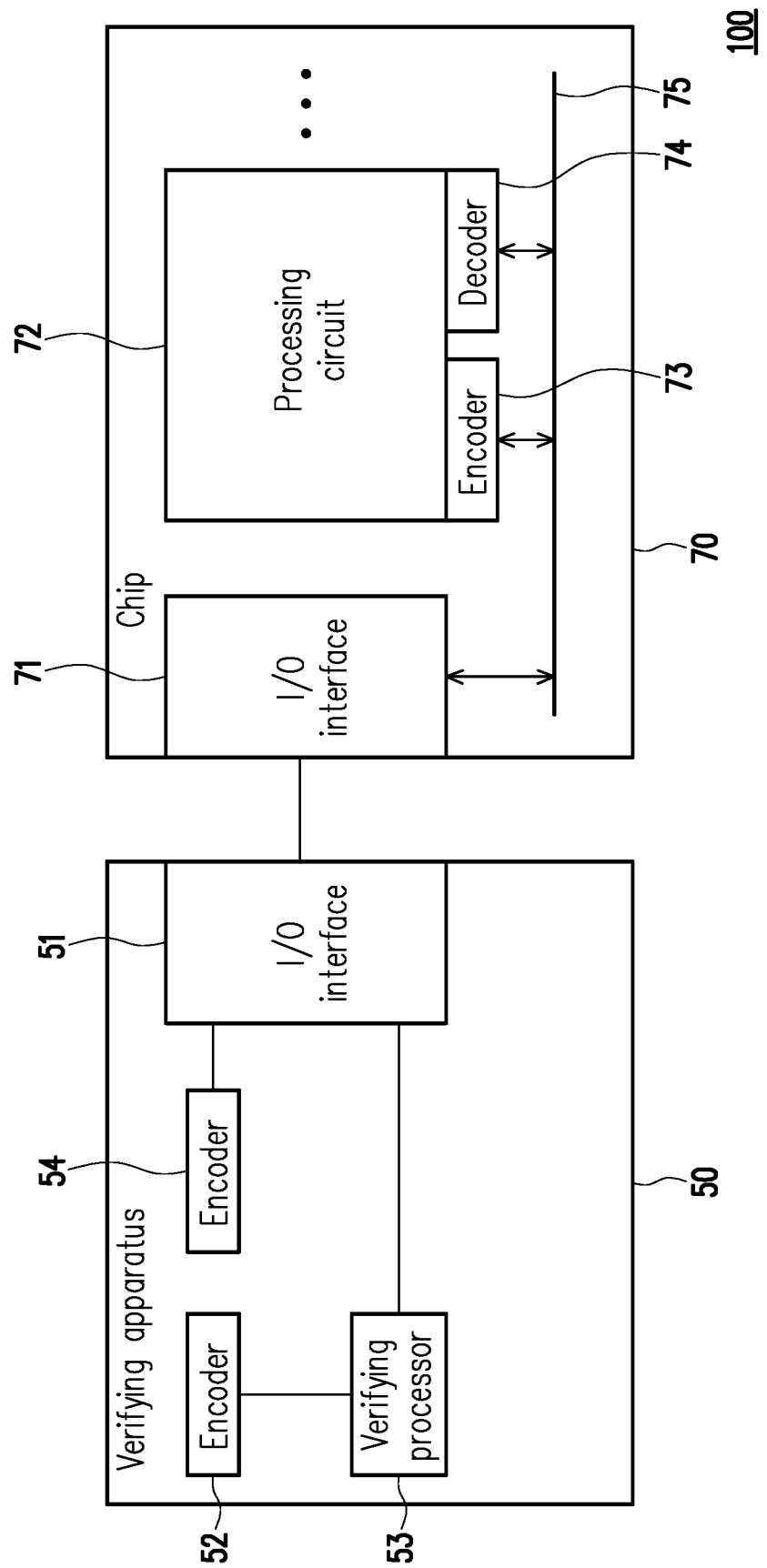
FIG. 1 is a block diagram illustrating a verifying system according to one of the exemplary embodiments of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram illustrating a verifying system 100 according to one of the exemplary embodiments of the disclosure. Referring to FIG. 1, the verifying system 100 includes, but not limited to, a verifying apparatus 50, and a chip 70.

The verifying apparatus 50 includes, but not limited to, an input/output (I/O) interface 51, two encoders 52 and 54, and a verifying processor 53. The verifying apparatus 50 could be a computer, a smartphone, a tablet, or other computing apparatuses.

The I/O interface 51 could be serial peripheral interface (SPI), inter-integrated circuit (I2C), universal asynchronous receiver transmitter (UART), or other interfaces. In one embodiment, the I/O interface 51 is used to connect an external apparatus or an electronic element, for example, the chip 70.

The encoders 52 and 54 and the verifying processor 53 could be a central processing unit (CPU), a microprocessor, a microcontroller, a digital signal processing (DSP) chip, a field-programmable gate array (FPGA), or the like. The functions of the encoders 52 and 54 and the verifying processor 53 may also be implemented by an independent electronic device or an integrated circuit (IC), and operations of the encoders 52 and 54 and the verifying processor 53 may also be implemented by software. In one embodiment, the encoder 52 is coupled to the verifying processor 53, and the encoder 53 and the verifying processor 53 are coupled to the I/O interface 51.

It should be noticed that, in some embodiments, two or all of the encoders 52 and 54 and the verifying processor 53 may be integrated into a single unit.

The chip 70 includes, but not limited to, one or more I/O interfaces 71, one or more processing circuits 72, one or more encoders 73, and one or more decoders 74.

The I/O interface 71 could be SPI, I2C, UART, or other interfaces. In one embodiment, the I/O interface 71 is used to connect an external apparatus or an electronic element, for example, the verifying apparatus 50.

The processing circuit 72 could be a CPU, a microprocessor, a digital processor, a random-access memory (RAM), a read-only memory (ROM), a flash memory, a graphics processor, an I/O controller, or any intellectual property (IP) block.

The encoder 73 and the decoder 74 could be a microprocessor, a digital processor or an IP block. In one embodiment, the encoder 73 and the decoder 74, as two single units, are coupled to processing circuit 72. In some embodiments, one or all of the encoder 73 and the decoder 74, as two functions, are integrated into the processing circuit 72.

In one embodiment, each processing circuit 72 may correspond to one encoder 73 and one decoder 74, i.e., one-to-one mapping. In some embodiments, multiple processing circuits 72 may correspond to the same encoder 73 and/or the same decoder 74, i.e., multiple-to-one mapping.

In one embodiment, the processing circuit 72, the encoder 73, and decoder 74 are coupled to the I/O interface 71 via network topology 75. The network topology 75 is an arrangement of channels and nodes (such as the processing circuit 72, the encoder 73, and the decoder 74) in an interconnection network such as a network-on-chip (NoC) or an on-chip bus architecture. The data transmitted from the I/O interface 71, the processing circuit 72, the encoder 73, or decoder 74 may be traveled via the network topology 75. The type of network topology 75 could be buses, crossbars, Butterfly and variants, torus, mesh, Clos, fat-tree, or other topologies.

To better understand the operating process provided in one or more embodiments of the disclosure, several embodiments will be exemplified below to elaborate the operating process of the verifying system 100. The devices and units in the verifying system 100 are applied in the following embodiments to explain the proposed method provided herein. Each step of the method can be adjusted according to actual implementation situations and should not be limited to what is described herein.

It should be noticed that the numbers of the I/O interface 71, the processing circuit 72, the encoder 73 and the decoder 74 are not limited in the embodiments of the disclosure. For ease of description, in some embodiments, merely one I/O interface 71, one processing circuit 72, one encoder 73, and/or one decoder 74 would be introduced to describe their functions or operations. However, other I/O interfaces 71, processing circuits 72, encoders 73, and/or decoders 74 may perform the same or similar functions or operations.

Figure 2:
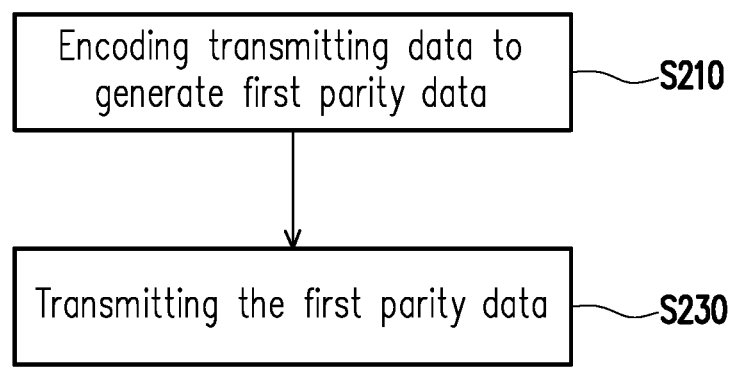
FIG. 2 is a flowchart illustrating a data verifying method according to one of the exemplary embodiments of the disclosure.

FIG. 2 is a flowchart illustrating a data verifying method according to one of the exemplary embodiments of the disclosure. Referring to FIG. 2, the encoder 73 may encode the transmitting data of the processing circuit 72, to generate one or more first parity data (step S210). Specifically, for the functional verification of one or more processing circuits 72, the verifying processor 53 of the verifying apparatus 50 may transmit one or more updating data to a to-be-test circuit (i.e., one of the processing circuits 72) through the I/O interface 51, so that the chip 70 receives the updating data through the I/O interface 71. The to-be-test circuit may process the updating data, to generate the transmitting data. That is, the transmitting data is a computing result generated by the to-be-test circuit. There would be one or more expected data in the verifying apparatus 50 used by the verifying processor 53 to verify the consistency with the corresponding one or more transmitting data. The verified result of the transmitting data may be further used to confirm whether the chip 70 or the processing circuit 72 is operated normally.

It should be noticed that the amount and/or the length of data transmitted in the network topology 75 may be limited by its bandwidth. In one embodiment, merely transmitting data from one processing circuit 72 is allowed to be transmitted via the network topology 75 at a time, and the other transmitting data from other processing circuits 72 may be idle or standby. However, in some embodiments, more transmitting data from more processing circuits 72 are allowed to be transmitted via the network topology 75 at a time. Obviously, the throughput of the chip 70 may be limited by the aforementioned limitations.

In one embodiment, a compressing mechanism for the transmitting data is introduced to reduce the amount of the transmitting data. In the compressing mechanism, the encoder 73 may encode the transmitting data based on the error detection code (such as cyclic redundancy check (CRC), parity check, or checksums) or error correction code (such as Hamming codes, repetition codes, or Reed-Solomon codes). Each first parity data is an encoded result of one transmitting data. The length of each first parity data is less than the corresponding transmitting data, so as to reduce the amount of data. Then, the first parity data could be used for data verification of the transmitting data, for example, the representative of the transmitting data.

It should be noted that, in some embodiments, the transmitting data may be compressed by other compression algorithm such as Huffman compression, Lempel-Ziv (LZ) compression, or Lempel-Ziv-Welch (LZW) algorithm.

The encoder 73 may transmit the one or more first parity data through the I/O interface 71 (S230), so that the verifying processor 53 may receive the first parity data through the I/O interface 51. In one embodiment, the encoder 73 may further combine multiple first parity data from one or more processing circuits 72 to form a first combined data. The length of the first combined data is not longer than the length of one of the transmitting data. Then, the encoder 73 may transmit the first combined data through the I/O interface 71. These first parity data in the first combined data represent multiple transmitting data. Therefore, multiple transmitting data may be transmitted at a time.

Figure 3:
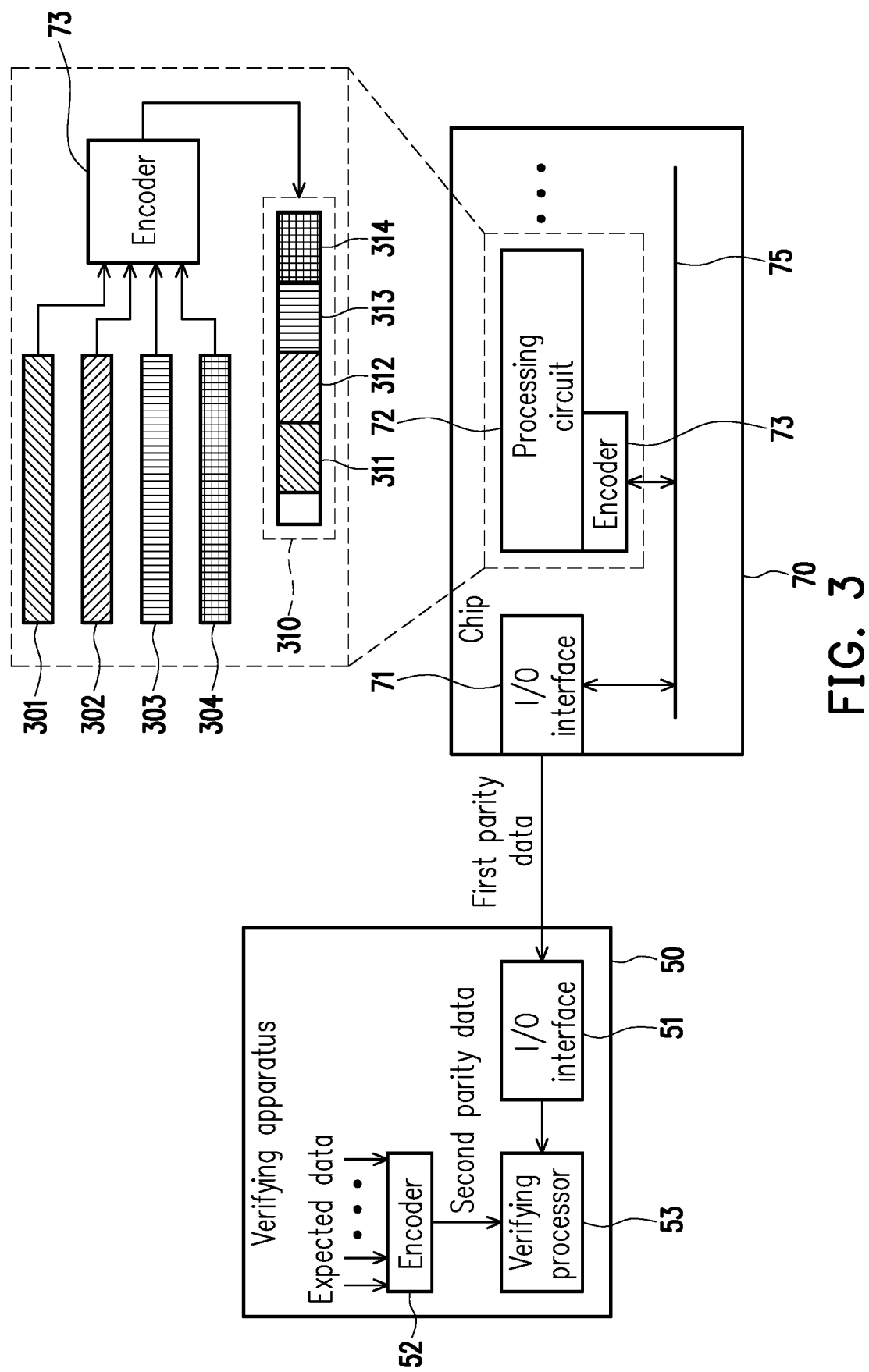
FIG. 3 is a schematic diagram illustrating a compressing method according to one of the exemplary embodiments of the disclosure.

FIG. 3 is a schematic diagram illustrating a compressing method according to one of the exemplary embodiments of the disclosure. Referring to FIG. 3, it is assumed four transmitting data 301, 302, 303 and 304 are generated by the processing circuit 72 (as the to-be-test circuit). The encoder 73 encodes the transmitting data 301, 302, 303 and 304, to generate the first parity data 311, 312, 313 and 314, respectively. The encoder 73 further combines the four first parity data 311, 312, 313 and 314 into a first combined data 310. Then, the first combined data 310 with the first parity data 311, 312, 313 and 314 would be transmitted to the verifying apparatus 50.

It should be noted that in some embodiments, merely one first parity data would be transmitted at a time.

On the other hand, referring to FIG. 3, in one embodiment, the encoder 52 of the verifying apparatus 50 (out of the chip 70) may encode one or more expected data to generate one or more second parity data. The expected data is used to confirm the consistency with the corresponding transmitting data of the to-be-test circuit. That is, the expected data is an expected computing result of the corresponding updating data, and the corresponding updating data may be expected to be processed with the same calculation of the to-be-test circuit. The encoder 52 is configured with the same error detection code, error correction code, or compression algorithm. Therefore, the verifying processor 53 could verify the consistency between one first parity data and the corresponding second parity data as the verification between the transmitting data and the corresponding expected data.

It should be noted that in some embodiments, a decoder (not shown) configured with the same error detection code, the same error correction code, or the corresponding decompression algorithm may be provided in the verifying apparatus 50, and the decoder may decode the first parity data, to generate the transmitting data. Then, the verifying processor 53 could verify the consistency between one transmitting data and the corresponding expected data.

The aforementioned embodiments introduce the compression mechanism for the data transmitted from the chip 70. However, the amount of data transmitted from the verifying apparatus 50 may be reduced, too.

Figure 4:
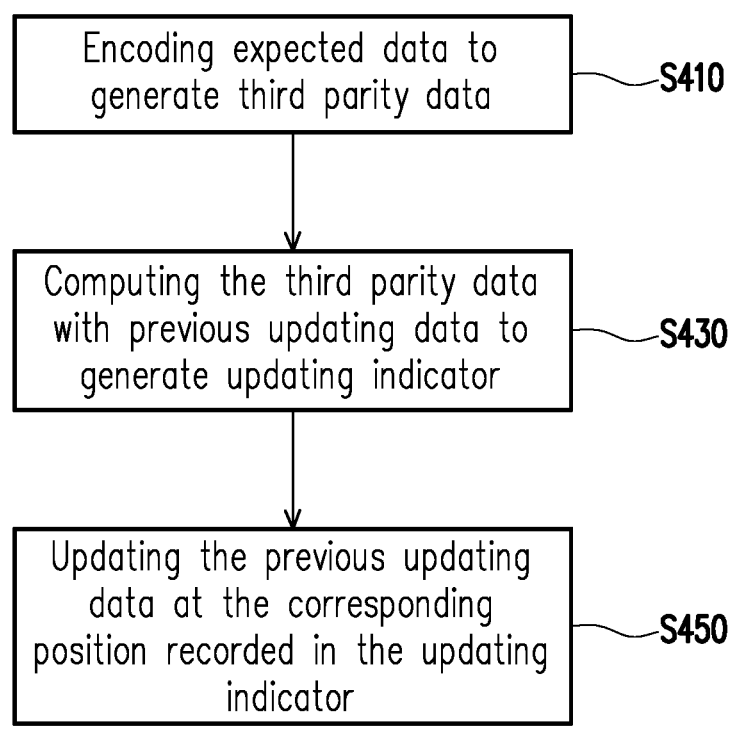
FIG. 4 is a flowchart illustrating a data updating method according to one of the exemplary embodiments of the disclosure.

FIG. 4 is a flowchart illustrating a data updating method according to one of the exemplary embodiments of the disclosure. Referring to FIG. 4, the encoder 54 of the verifying apparatus 50 (out of the chip 70) may encode one or more current updating data to generate one or more third parity data (step S410). Specifically, the current updating data represents the updating data currently to be transmitted to the chip 70 and used for generating the transmitting data by the processing circuit 72. In one embodiment, the encoder 54 may encode the current updating data based on the error correction code (such as Hamming codes, repetition codes, or Reed-Solomon codes). Each third parity data is an encoded result of one current updating data. The length of each third parity data is less than the corresponding current updating data, so as to reduce the amount of data. It should be noticed that the third parity data is related to the difference between the current updating data and previous updating data. The previous updating data represents the updating data previously transmitted to the chip 70, i.e., the previous updating data is transmitted before the current updating data and used for generating the transmitting data by the processing circuit 72. The difference may that the values at the same position of the previous updating data and the current updating data are different. Then, the third parity data could be the representative of the current updating data.

It should be noted that, in some embodiments, the third parity data may include one or more positions where the values of the previous updating data and the current updating data are different. For example, the values at the third position of the previous updating data and the current updating data are different, and the third parity data could be "0011".

The encoder 54 may transmit the one or more third parity data through the I/O interface 51, so that the chip 70 may receive the third parity data through the I/O interface 71. In one embodiment, the encoder 54 may further combine multiple third parity data to form a second combined data. The length of the second combined data is not longer than the length of one of the updating data. Then, the encoder 54 may transmit the second combined data through the I/O interface 51. These third parity data in the second combined data represent multiple updating data. Therefore, multiple updating data may be transmitted at a time.

It should be noted that in some embodiments, merely a third parity data would be transmitted at a time.

On the other hand, the decoder 74 may compute the third parity data with the previous updating data to generate one or more updating indicator (step S430). In one embodiment, the third parity data and the previous updating data are computed based on the same error correction code as the encoder 54's encoding algorithm. Each updating indicator is a computed result of the third parity data and the corresponding previous updating data. Furthermore, the updating indicator represents the difference that the values at the same position of the previous updating data and the current updating data are different. That is, the updating indicator may record one or more positions where the values of the previous updating data and the current updating data are different.

The decoder 74 may update one or more previous updating data at the corresponding position recorded in the updating indicator, to generate one or more current updating data (step S450). It is assumed that the value recorded in the updating data is binary, such as "1" or "0". The way that the decoder 74 updates the value of the previous updating data may be that, for example, "0" would be modified to "1" or "1" would be modified to "0". The previous updating data is updated according to the difference with the current updating data, so that the previous updating data would changed into the current updating data. Then, the processing circuit 72 may process the current updating data to generate the transmitting data as mentioned before.

Figure 5:
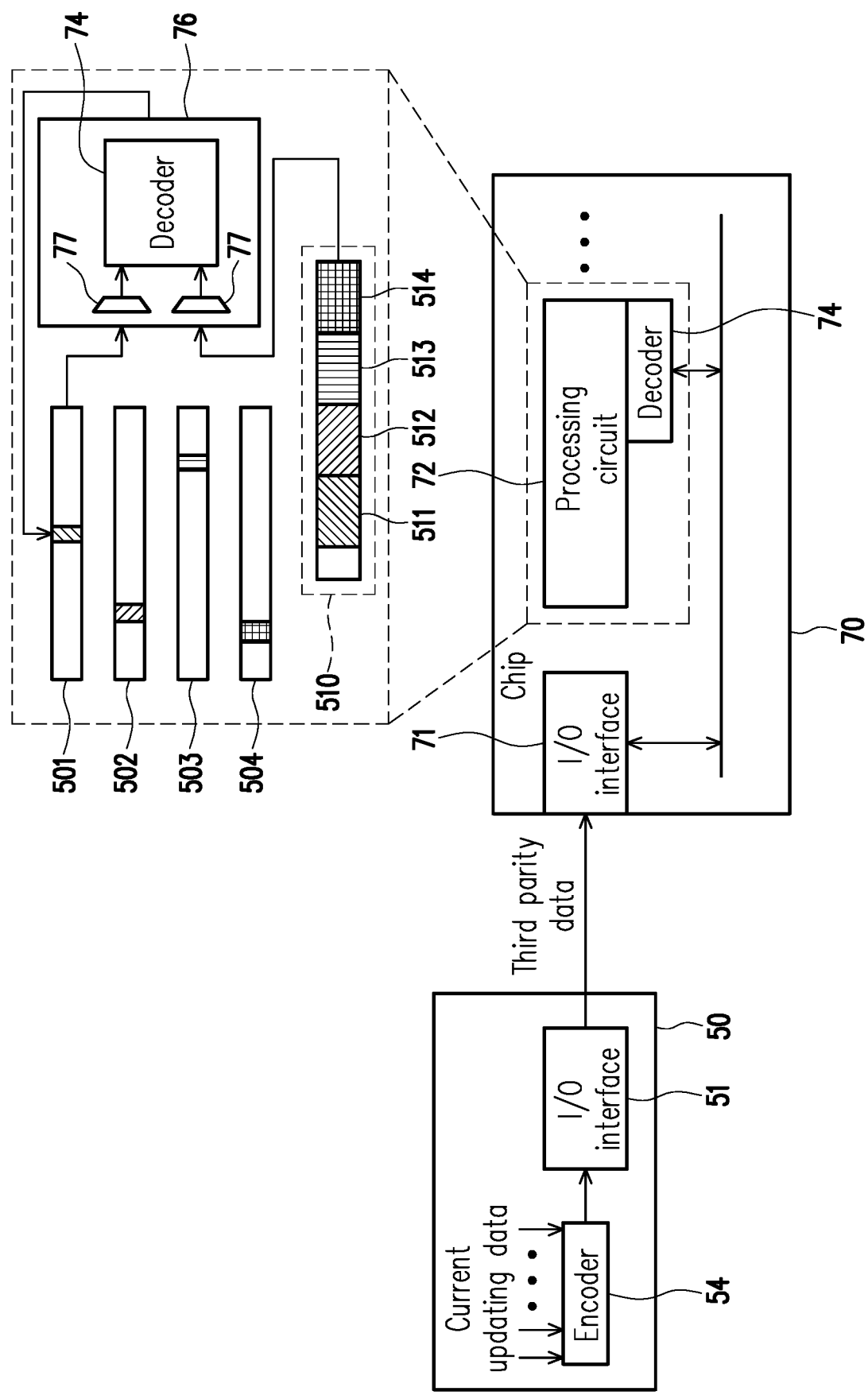
FIG. 5 is a schematic diagram illustrating a compressing method according to one of the exemplary embodiments of the disclosure.

FIG. 5 is a schematic diagram illustrating a compressing method according to one of the exemplary embodiments of the disclosure. Referring to FIG. 5, it is assumed four third parity data 511, 512, 513 and 514 are generated from the current updating data by the encoder 54, and a second combined data 510 with the third parity data 511, 512, 513 and 514 is transmitted to the chip 70. The controller 76 may control the two multiplexer 77 to output one of the third parity data 511, 512, 513 and 514 and output the corresponding one of the previous updating data 501, 502, 503 and 504, respectively, into the decoder 74. Then, the decoder 74 decodes the third parity data 511, 512, 513 and 514 with the previous updating data 501, 502, 503 and 504, respectively, to generate the updating indicator. The decoder 74 further modifies the value of the previous updating data 501, 502, 503 and 504 at the corresponding position (as shown in the drawing) recorded in the updating indicator, to form the current updating data.

It should be noted that in some embodiments, the third parity data may directly record one or more positions where the values of the current updating data and the previous updating data are different. The decoder 74 may directly use the third parity data to generate the current updating data.

On the basis of the inventive spirit of the aforementioned embodiments, an example would be described for further understanding of the embodiments of the disclosure.

It is assumed an SPI read and write test would be performed. The first step is to reset (i.e., writing all zero), then the verifying apparatus 50 reads data from the chip 70 and checks whether the data are all zero in an SPI register (i.e., a to-be-test circuit). The verifying apparatus 50 writes data (32'hFFFF_FFFF) into the SPI register, then reads the data from the chip 70 and checks whether the data 32'hFFFF_FFFF in the SPI register. The verifying apparatus 50 writes random data into the SPI register, then reads the data from the chip 70 and checks whether the random data in the SPI register. Table (1) is a relationship among the commands, the number of data, and the number of clock cycles per data.

TABLE 1

| Command | number of data | number of clock cycles/per data |
| --- | --- | --- |
| Write | 20 | 344 |
| Read | 20 | 382 |

That is, for the write command, 20 data would be transmitted to the chip 70, and each data may take 344 clock cycles. For the read command, 20 data would be received from the chip 70, and each data may take 382 clock cycles.

Table (2) is an experiment result of conventional way without compressing data, and table (3) is another experiment result of the proposed way with compressing data. Compared to tables (2) and (3), almost 65% of the time could be reduced.

TABLE 2

| Read all zero | Write 32'hFFFF_FFFF | Read and check 32'hFFFF_FFFF | Write random data | Read and check random data | Total |
|---|---|---|---|---|---|
| 382 * 20 clock cycles | 344 * 20 = 6880 clock cycles | 382 * 20 = 7560 clock cycles | 344 * 20 = 6880 clock cycles | 382 * 20 = 7560 clock cycles | 36680 clock cycles |

TABLE 3

| Read all zero | Write 32'hFFFF_FFFF | Read and check 32'hFFFF_FFFF | Write random data | Read and check random data | Total |
|---|---|---|---|---|---|
| 382 * 4 clock cycles | 344 * 20 = 6880 clock cycles | 382 * 4 = 7560 clock cycles | 344 * 4 = 6880 clock cycles | 382 * 4 = 7560 clock cycles | 12840 clock cycles |

In accordance with some embodiments, the transmitting data generated by the processing circuit of the chip may be encoded, and the current updating data of the verifying apparatus may be encoded, to reduce the amount of data. Furthermore, the updating data could be obtained according to the updating indicator decoded from the parity data and the previous updating data. Whether or not the number of the I/O interfaces are limited, the transmission efficiency could be improved.

In accordance with some embodiments, a data verifying method includes the following steps. A first encoder is provided for one or more processing circuits of a chip. One or more transmitting data of a to-be-test circuit of the processing circuit are encoded, through the first encoder, to generate one or more first parity data. The transmitting data is a computing result generated by the to-be-test circuit. The first parity data is transmitted without the transmitting data. The first parity data is used for data verification of the transmitting data.

In accordance with some embodiments, a chip includes an I/O interface, one or more processing circuits coupled to the I/O interface, and an encoder coupled to the processing circuit and the I/O interface. The encoder encodes one or more transmitting data of a to-be-test circuit of the processing circuit to generate at least one first parity data, and the transmitting data is a computing result generated by the to-be-test circuit. The encoder transmits the at least one first parity data without the at least one transmitting data through the I/O interface. The first parity data is used for data verification of the transmitting data.

In accordance with some embodiments, a verifying apparatus includes an I/O interface adapted for connecting with a chip, a first encoder, and a verifying processor coupled to the first encoder and the I/O interface. The verifying processor receives one or more first parity data through the I/O interface, the first encoder encodes one or more expected data to generate one or more second parity data, and the verifying processor verifies the consistency between one first parity data and the corresponding second parity data.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A data verifying method, comprising:
providing a first encoder for at least one processing circuit of a chip;
encoding, through the first encoder, at least one transmitting data of a to-be-test circuit of the at least one processing circuit to generate at least one first parity data, wherein the at least one transmitting data is a computing result generated by the to-be-test circuit;
transmitting the at least one first parity data without the at least one transmitting data, wherein the at least one first parity data is used for data verification of the at least one transmitting data;
providing a decoder for the at least one processing circuit of the chip;
computing, through the decoder, at least one second parity data with at least one previous updating data to generate at least one updating indicator;
updating the at least one previous updating data at corresponding position recorded in the at least one updating indicator, to generate at least one current updating data, wherein the at least one previous updating data and the at least one current updating data are used for generating the at least one transmitting data.

2. The data verifying method according to claim 1, wherein the step of encoding the at least one transmitting data of the to-be-test circuit comprises:
encoding the at least transmitting data based on error detection code or error correction code, wherein each of the at least one first parity data is an encoded result of the at least one transmitting data.

3. The data verifying method according to claim 1, wherein the step of encoding the at least one transmitting data of the to-be-test circuit comprises:
combining a plurality of the first parity data to form a first combined data, wherein a length of the first combined data is not longer than a length of one of the at least one transmitting data, and the step of transmitting the at least one first parity data comprises:
transmitting the first combined data.

4. The data verifying method according to claim 1, wherein before the step of encoding the at least one transmitting data of the to-be-test circuit, the data verifying method further comprises:

receiving at least one updating data; and processing, through the to-be-test circuit, the at least one updating data to generate the at least one transmitting data.

5. The data verifying method according to claim 1, wherein after the step of transmitting the at least one first parity data, the data verifying method further comprises:

providing a second encoder out of the chip;

encoding, through the second encoder, at least one expected data to generate at least one third parity data; and verifying consistency between one of the at least one first parity data and corresponding third parity data.

6. The data verifying method according to claim 1, further comprising:

providing a third encoder out of the chip;

encoding, through the third encoder, the at least one current updating data to generate the at least one second parity data.

7. The data verifying method according to claim 1, wherein the step of computing the at least one second parity data with the at least one previous updating data comprises:

computing the at least one second parity data with the at least one previous updating data based on error correction code, wherein each of the at least one updating indicator is a computed result of the at least one second parity data and the at least one previous updating data.

8. The data verifying method according to claim 1, wherein before the step of computing the at least one second parity data with the at least one previous updating data, the data verifying method further comprises:

receiving a second combined data, wherein the second combined data comprises a plurality of the second parity data, and a length of the second combined data is not longer than a length of one of the at least one current updating data.

9. A chip, comprising:

an input/output (I/O) interface;

at least one processing circuit, coupled to the I/O interface; and an encoder, coupled to the at least one processing circuit and the I/O interface, wherein the encoder encodes at least one transmitting data of a to-be-test circuit of the at least one processing circuit to generate at least one first parity data, the at least one transmitting data is a computing result generated by the to-be-test circuit, and the encoder transmits the at least one first parity data without the at least one transmitting data through the I/O interface, wherein the at least one first parity data is used for data verification of the at least one transmitting data; and a decoder, coupled to the at least one processing circuit and the I/O interface, wherein the decoder computes at least one second parity data with at least one previous updating data to generate at least one updating indicator, and the decoder updates the at least one previous updating data at corresponding position recorded in the at least one updating indicator, to generate at least one current updating data, wherein the at least one previous updating data and the at least one current updating data are used for generating the at least one transmitting data.

10. The chip according to claim 9, wherein the encoder encodes the at least one transmitting data based on error detection code or error correction code, and each of the at least one first parity data is an encoded result of the at least one transmitting data.

11. The chip according to claim 9, wherein the encoder combines a plurality of the first parity data to form a first combined data, wherein a length of the first combined data is not longer than a length of one of the at least one transmitting data, and the encoder transmits the first combined data through the I/O interface.

12. The chip according to claim 9, wherein the to-be-test circuit receives at least one updating data and processes the at least one updating data to generate the at least one transmitting data.

13. The chip according to claim 9, wherein the decoder computes the at least one second parity data with the at least one previous updating data based on error correction code, wherein each of the at least one updating indicator is a computed result of the at least one second parity data and the at least one previous updating data.

14. The chip according to claim 9, comprising:

a plurality of the processing circuits coupled with network topology, wherein merely the at least one transmitting data from one of the processing circuits is allowed to be transmitted via the network topology at a time.

15. A verifying apparatus, comprising:

an input/output (I/O) interface, adapted for connecting with a chip;

a first encoder;

a verifying processor, coupled to the first encoder and the I/O interface, wherein the verifying processor receives at least one first parity data through the I/O interface, the first encoder encodes at least one expected data to generate at least one second parity data, and the verifying processor verifies consistency between one of the at least one first parity data and corresponding second parity data; and a second encoder, coupled to the verifying processor and the I/O interface, wherein the second encoder encodes at least one current updating data to generate at least one third parity data, and the second encoder transmits the at least one third parity data through the I/O interface, wherein the at least one third parity data is related to at least one position where at least one current updating data is different from corresponding previous updating data.

16. The verifying apparatus according to claim 15, wherein the verifying processor transmits at least one updating data through the I/O interface, and one of the at least one expected data is a computing result of corresponding updating data.

17. The verifying apparatus according to claim 15, wherein the second encoder combines a plurality of the third parity data to form a combined data, and the second encoder transmits the combined data through the I/O interface, wherein a length of the combined data is not longer than a length of one of the at least one current updating data.

* * * * *